United States Patent
Bencher et al.

(10) Patent No.: US 9,478,421 B2
(45) Date of Patent: *Oct. 25, 2016

(54) OPTICALLY TUNED HARDMASK FOR MULTI-PATTERNING APPLICATIONS

(71) Applicant: Applied Materials, Inc., Santa Clara, CA (US)

(72) Inventors: Christopher Dennis Bencher, Cupertino, CA (US); Daniel Lee Diehl, Chiba (JP); Huixiong Dai, San Jose, CA (US); Yong Cao, San Jose, CA (US); Tingjun Xu, San Jose, CA (US); Weimin Zeng, San Jose, CA (US); Peng Xie, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/878,514

(22) Filed: Oct. 8, 2015

(65) Prior Publication Data

US 2016/0042951 A1    Feb. 11, 2016

Related U.S. Application Data (63) Continuation of application No. 14/269,010, filed on May 2, 2014, now Pat. No. 9,177,796.

(60) Provisional application No. 61/819,334, filed on May 3, 2013.

(51) Int. Cl.
  *H01L 21/033* (2006.01)
  *H01L 21/02* (2006.01)
  (Continued)

(52) U.S. Cl.
  CPC ....... *H01L 21/0337* (2013.01); *C23C 14/0042* (2013.01); *C23C 14/06* (2013.01);
  (Continued)

(58) Field of Classification Search
  CPC .................................................. H01L 21/0276
  USPC .......................................................... 438/786
  See application file for complete search history.

(56) References Cited

U.S. PATENT DOCUMENTS

| 4,737,015 A | 4/1988 | Ishida et al. |
|---|---|---|
| 5,935,735 A | 8/1999 | Okubo et al. |

(Continued)

FOREIGN PATENT DOCUMENTS

| JP | 02008852 A | 1/1990 |
|---|---|---|
| JP | 2003262750 A | 9/2003 |
| KP | 10-2010-002067 A | 1/2010 |

OTHER PUBLICATIONS

PCT international search report and written opinion of PCT/US2014/036586 dated Sep. 15, 2014. Search report is being used as the English translation for Foreign Reference No. KR 10-2010-0002067.

*Primary Examiner* — George Fourson, III
(74) *Attorney, Agent, or Firm* — Patterson & Sheridan, LLP (57) ABSTRACT

The embodiments herein provides methods for forming a PVD silicon oxide or silicon rich oxide, or PVD SiN or silicon rich SiN, or SiC or silicon rich SiC, or combination of the preceding including a variation which includes controlled doping of hydrogen into the compounds heretofore referred to as $SiO_xN_yC_z{:}H_w$, where w, x, y, and z can vary in concentration from 0% to 100%, is produced as a hardmask with optical properties that are substantially matched to the photo-resists at the exposure wavelength. Thus making the hardmask optically planarized with respect to the photo-resist. This allows for multiple sequences of litho and etches in the hardmask while the photo-resist maintains essentially no optical topography or reflectivity variations.

13 Claims, 7 Drawing Sheets

(51) Int. Cl.
  *H01L 21/027* (2006.01)
  *H01L 21/3105* (2006.01)
  *H01L 21/311* (2006.01)
  *C23C 14/00* (2006.01)
  *C23C 14/06* (2006.01)
  *C23C 14/14* (2006.01)
  *C23C 14/35* (2006.01)
  *H01L 21/308* (2006.01)
(52) U.S. Cl.
  CPC ............ *C23C 14/14* (2013.01); *C23C 14/351* (2013.01); *H01L 21/0214* (2013.01); *H01L 21/0276* (2013.01); *H01L 21/02126* (2013.01); *H01L 21/02266* (2013.01); *H01L 21/0332* (2013.01); *H01L 21/3081* (2013.01); *H01L 21/3086* (2013.01); *H01L 21/3105* (2013.01); *H01L 21/31138* (2013.01); *H01L 21/31144* (2013.01)

(56) References Cited

U.S. PATENT DOCUMENTS

| | | |
|---|---|---|
| 6,562,544 B1 | 5/2003 | Cheung et al. |
| 2003/0077887 A1 | 4/2003 | Jang et al. |
| 2003/0087518 A1 | 5/2003 | Chen et al. |
| 2006/0205223 A1 | 9/2006 | Smayling |
| 2012/0038021 A1 | 2/2012 | Chen et al. |
| 2012/0100467 A1 | 4/2012 | Kaneko et al. |

OPTICALLY TUNED HARDMASK FOR MULTI-PATTERNING APPLICATIONS

CROSS-REFERENCE TO RELATED APPLICATIONS

This application is a continuation application of U.S. patent application Ser. No. 14/269,010, filed May 2, 2014 and claims benefit of U.S. Provisional Application Ser. No. 61/819,334, filed May 3, 2013, both of which are incorporated by reference in their entirety.

BACKGROUND OF THE DISCLOSURE

1. Field of the Invention

The embodiments herein generally relate to a fabrication process for forming a hardmask for use in a lithographic multi-patterning fabrication process.

2. Description of the Background Art

Reliably producing submicron and smaller features is one of the key requirements of very large scale integration (VLSI) and ultra large scale integration (ULSI) of semiconductor devices. However, with the continued miniaturization of circuit technology, the dimensions of the size and pitch of circuit features, such as interconnects, have placed additional demands on processing capabilities. The multilevel interconnects that lie at the heart of this technology require precise imaging and placement of high aspect ratio features, such as vias and other interconnects. Reliable formation of these interconnects is critical to further increases in device and interconnect density. Additionally, forming sub-micron size features and interconnects with reduced waste of intermediate materials, such as resists and hardmask materials, is desired.

As circuit densities increase for next generation devices, the width or pitch of interconnects, such as vias, trenches, contacts, devices, gates and other features, as well as the dielectric materials there between, are decreasing to 45 nm and 32 nm dimensions, As device scaling was extended to further below the resolution limit of the lithography scanners, multi-patterning was employed to enable meeting the feature density requirements of today's integrated devices. Multi-patterning is a process of performing several resist coating, lithographic patterning, and etching operations to ultimately pattern a film layer in multiple steps. When combined, the overlapping pattern operations form the features in an underlying hardmask layer, which when fully patterned, may be used to pattern an underlying layer, or serve as an implant or diffusion mask.

During simple, non-multi-patterning of an underlying hardmask layer, the current "ultra violet light" wavelengths used for exposure will reflect off the un-patterned interface of the resist and conventional hardmask layer, and may also reflect off the underlying previously formed features, and will as a result, affect the precision of the sidewalls and size of the exposed and developed features in the resist. To correct for this, optical proximity correction (OPC) may be employed in the lithograph mask, which results in an intentional distortion of the position where the resist exposing wavelength reaches the resist, with the result that actually formed developed feature meets a desired feature size and profile. However, with smaller geometries and reflection of the provided exposure's ultra violet electromagnetic energy, OPC is unable to cure distortion effects without additional processing.

One enabler of multiple patterning has been the use of optically opaque films to block the exposure wavelength from penetrating to the previously masked hardmask layer, which is sometimes called a memory or memorization, layer. The function of the memory layer is to serve as the hardmask for etching a pattern into a layer there below which may, for example, be a dielectric material, or may, for example, be a mask for another purpose. To pattern the memory layer multiple times, a tri-layer scheme, having an uppermost resist layer, is used in each pattern step. The tri-layer has sufficient opacity to prevent the lithographic resist exposure wavelength from reaching the surface of the memory layer and thus preventing reflections of the exposure electromagnetic energy off of previously formed hardmask features back into the resist, which would result in unintended exposure of areas therein. After each patterning step of the multi-patterning scheme, the tri-layer must be stripped off with wet and/or gas based chemistries, and the wafer and the memory layer must be wet cleaned and dried and a new tri-layer applied thereto before the next pattern of the multi-pattern can be formed in the memory layer.

While the benefits of multiple patterning in terms of resolution, depth of focus and lithographic defect sensitivity are understood, there is additional desire to control the process budget and increase and maintain yield.

Therefore, there is a need for an improved method for lithographically creating a multi-patterned hardmask on a substrate.

SUMMARY OF THE INVENTION

The embodiments herein provide apparatus and methods for performing multi-patterning of a memory or hardmask layer without the need for repeatedly ashing and depositing an optically opaque material or a tri-layer stack, and where only the resist need be stripped, and re-applied after the substrate is cleaned, to perform the next patterning step on the hardmask. In one aspect this is accomplished by applying, as the hardmask layer, a thin film which is optically tuned to match, or very nearly match, the optical characteristics of the resist at the wavelength of the lithography exposure step, thereby providing a hardmask layer which does not create reflection at the resist-hardmask layer interface. In one embodiment, the memory layer is a PVD deposited silicon oxide or silicon rich oxide, or a PVD SiN or silicon rich SiN, or SiC or silicon rich SiC, or a combination of the preceding including a variation which includes controlled doping of hydrogen into the compounds, heretofore referred to as $SiO_xN_yC_z:H_w$, where w, x, y, and z can vary in concentration relative to each other from 0% to 100%. The memory layer, such as the $SiO_xN_yC_z:H_w$ layer, has optical properties that are substantially similar, or nearly matched, to the optical properties of the photo-resist to be formed and patterned thereon, at the exposure wavelength (typically 193 nm for advanced lithography). Thus the interface of the photo-resist and the memory (hardmask) layer is optically "invisible" to the exposure wavelength. This allows for multiple sequences of litho and etching of the hardmask without the need to apply, pattern, and strip intermediate material layers while the exposed photo-resist has essentially no optical topography or reflectivity induced variations from the desired exposure pattern. As a result, each subsequent lithography exposure experiences the same or nearly the same reflectivity, eliminating the need to perform complex optical proximity corrections, and apply multiple complex tri-layers followed by litho, etch and strip of the tri-layer.

The embodiments herein include hardware for forming the optically matched hardmask which includes a pumping system and chamber cooling system, a full face erosion magnetron cathode, a process kit and gas flow design, an electro-static chuck (ESC), a pulsed DC power supply, a doped silicon target, and H and/or O and/or N and/or C containing gas supplies.

In some embodiments, the hardware is configured to enable formation of an optically matched, to a specifically desired resist, $SiO_xN_yC_z:H_w$ layer. The $SiO_xN_yC_z:H_w$ film refractive index (n) and extinction coefficient ($K$) are tunable by adjusting gas flows and the resultant film w, x, y and z values, to match the optical properties of the film to the resist used to etch the layer.

Embodiments of the disclosure may provide a method for forming a hardmask on a film stack, comprising sputtering a material comprising silicon from a target disposed in a chamber onto a surface of a substrate, and delivering a flow of a process gas while sputtering the material comprising silicon from the target, wherein the process gas comprises oxygen and nitrogen, and wherein the ratio of oxygen to nitrogen in the process gas is adjusted so that an optical property of the sputtered material has an substantially equivalent value as the optical property of a photo-resist layer, which is to be disposed on a surface of the sputtered material, at an intended lithography exposure wavelength.

Embodiments of the disclosure may further provide a hardmask layer, comprising a $SiO_xN_y$ layer disposed on a surface of a substrate, wherein the silicon, oxygen and nitrogen content of $SiO_xN_y$ layer are adjusted so that a refractive index (n) of the $SiO_xN_y$ layer is substantially equal to a refractive index (n) of a resist layer to be formed thereon, and the refractive indices are measured at an intended lithography exposure wavelength. The $SiO_xN_y$ layer may also have an extinction coefficient that is substantially equal to an extinction coefficient of the resist layer to be formed thereon.

BRIEF DESCRIPTION OF THE DRAWINGS

So that the manner in which the above recited features of the embodiments herein are attained and can be understood in detail, a more particular description of the invention, briefly summarized above, may be had by reference to the embodiments thereof which are illustrated in the appended drawings.

FIGS. 4A to 4M depict a process flow for multi-patterning the hardmask layer using a single-layer etch.

To facilitate understanding of the embodiments, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments and are therefore not to be considered limiting of its scope, for the invention may admit to other equally effective embodiments.

DETAILED DESCRIPTION

In some embodiments, a hardmask layer is provided having optical properties, with respect to those of an overlying photo-resist layer, that are substantially similar. The optical properties of the hardmask layer are such that the internal reflections and refractions of light at the photo-resist's lithographic wavelengths do not occur, or are minimized to such an extent that degradation of the precision of the exposed photo-resist feature does not occur. The hardmask layer is provided to be patterned a multiple number of times by repeating the steps of forming a photo-resist on the hardmask layer, exposing the photo-resist, transferring the developed pattern from the photo-resist to the hardmask layer, and stripping/ashing the photo-resist to remove the photo-resist from the hardmask layer and then cleaning and drying the hardmask layer for receipt of another layer of photo-resist directly thereon.

The hardmask layer, also called a memory layer, may be located directly on a semiconductor layer, such as a wafer, and provide a mask thereon for ion implanting or diffusing of dopants into the substrate, and may also be used in the formation of openings in deposited film layers for the formation of interconnects, as well as other features and devices, such as film layers for raised gates, capacitors, etc, which may be formed above the substrate surface.

The embodiment specifically described herein disclose methods for ultimately forming a multi-patterned hardmask ultimately to be used to pattern and etch a dielectric interconnect material for the formation of metal containing features with high aspect ratios and/or with small dimensions therein. As discussed herein, high aspect ratio of the features refers to the submicron structures having aspect ratio in excess of 4:1, and small dimensions refer to the submicron structures having dimensions are about less than 55 nm. The deposition process may include supplying at least an inert gas into the processing chamber during processing. By adjusting the gas ratio and partial pressure of the inert gas supplied in the gas mixture during the deposition process, a good profile control and film uniformity formed across the substrate surface may be obtained.

The embodiments herein provide methods for forming a physical vapor deposition, hereinafter PVD, silicon oxide or silicon rich oxide, or PVD SiN or silicon rich SiN, or SiC or silicon rich SiC, or a combination of the preceding including a variation which includes controlled doping of hydrogen into the compounds, heretofore referred to as $SiO_xN_yC_z:H_w$, where w, x, y, and z can vary in concentration from 0% to 100%. The $SiO_xN_yC_z:H_w$ layer is produced as a hardmask with optical properties that are sufficiently matched to a photo-resists that will be applied there over and used to etch the $SiO_xN_yC_z:H_w$ film layer, which is sometimes broadly referred to herein as a SiONC film layer, at the exposure wavelength (193 nm for advanced lithography), to make the hardmask optically indistinguishable from the photo-resist. In some configurations, the $SiO_xN_yC_z:H_w$ layer may comprise a $SiO_xC_z:H_w$ layer, a $SiO_xN_y:H_w$ layer or a $SiO_xN_yC_z:H_w$ layer that has desirable optical properties. The matching of the optical properties of the hardmask and the resist allows for multiple sequences of litho, etch, resist strip and reapplication of resist directly on the hardmask for further hardmask patterning; while the resist remains essentially "optically planarized" with no meaningful optical topography or variations in reflectivity of the resist, for example.

This enables subsequent lithography exposures to experience the same or substantially the same, reflectivity, eliminating the need to simulate and perform complex optical proximity corrections. Additionally, multiple complex tri-layer cycles of litho, etc and strip, are eliminated, as only a single resist layer need be applied direction on the hardmask.

Figure 1:
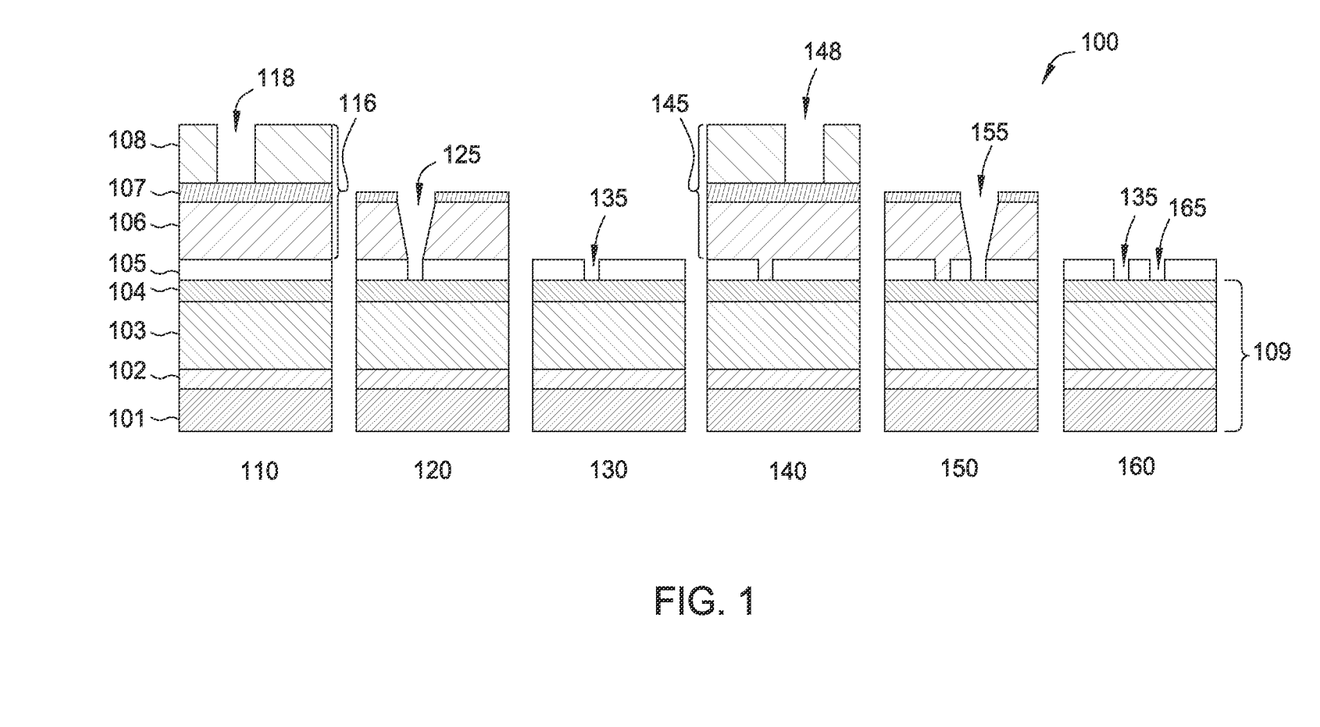
FIG. 1 depicts a conventional cycle for multi-patterning a hardmask layer using a tri-Layer etch.

FIG. 1 depicts an example of a conventional prior art cycle 100 for multi-patterning a hardmask layer using a tri-Layer photo-resist that will be applied thereover and used to etch a $SiO_2$ film layer. The conventional cycle 100 is depicted in snapshots 110 through 160 of FIG. 1, which are depictions of the same portions of the substrate as processing thereof progresses. In the example, a double hardmask etching layer paradigm is shown, wherein the ultimate layer to be patterned, low-K layer 101, is covered by a first hardmask 102, a first optical planarization layer 103 and an ashing barrier 104, and the memorization layer 105 is formed thereover. Specifically, a substrate 109 includes a low $\mathcal{K}$ material 101 over which a titanium nitride (TiN) metal hardmask 102 layer is formed, and the first optical planarization layer 103 and the ashing barrier 104 is formed there over. A memorization layer 105 (a hardmask layer) is disposed on a top surface of the ashing barrier 104. Disposed on the top of the memorization layer 105 is a tri-layer 116. The tri-layer includes a second optical planarization layer 106 and a silicon containing anti-reflective layer 107 and a photo-resist 108 formed thereon, in that order. In the prior art, the memorization layer is formed using chemical vapor deposition, wherein silicon and oxygen precursors combine, typically in a plasma environment, to form the hardmask film.

In the first snapshot 110, lithography was used to expose the photo-resist 108 and a pattern feature 118 was developed in the photo-resist 108. The feature 118 represents an area where photo-resist 108 was removed by the lithographic exposure and subsequent development of the resist.

In the second snapshot 120, an etching process is performed to etch a first feature 125 through the second optical planarization layer 106 and the memorization layer 105. During the etching process, the photo-resist 108 is at least partially etched away and an exposed portion of the silicon anti-reflective layer 107, the second optical planarization layer 106 and the memorization layer 105 are etched.

In the third snapshot 130, the tri-layer 116 is ashed or otherwise stripped from the memorization layer 105. This leaves the partially patterned memorization layer 105 on the top surface of the layer stack. Additionally, the memorization layer has an opening 135 therethrough as a result of the previous etching process as shown in the second snapshot 120. The opening 135 is only a portion of the total pattern required to be created in the memorization layer 105. However, due to the created topography, further lithography of the memorization layer 105 requires the re-planarization of, and optical isolation of, the memorization layer 105. Therefore another tri-layer 145 is formed on top of the memorization layer 105. This involves depositing a third application of the second optical planarization layer 106 and the silicon anti-reflective layer 107, followed by the application of the photo-resist 108 there over.

In the fourth snapshot 140, the newly reformed tri-layer 145 has been patterned after a lithographically exposing and developing the resist layer 108 to form a second pattern 148. The second pattern 148 is used in the second etch shown in the fifth snapshot 150. The second etch step removes material (shown as a funnel shaped feature or opening 155) in the reformed tri-layer 145 and the memorization layer 105. As shown in a sixth snapshot 160, after a second stripping process, remnants of the tri-layer (145) above the memorization layer 105 are removed. The memorization layer 105 now has two formed openings, 135 and 165.

Figure 2:
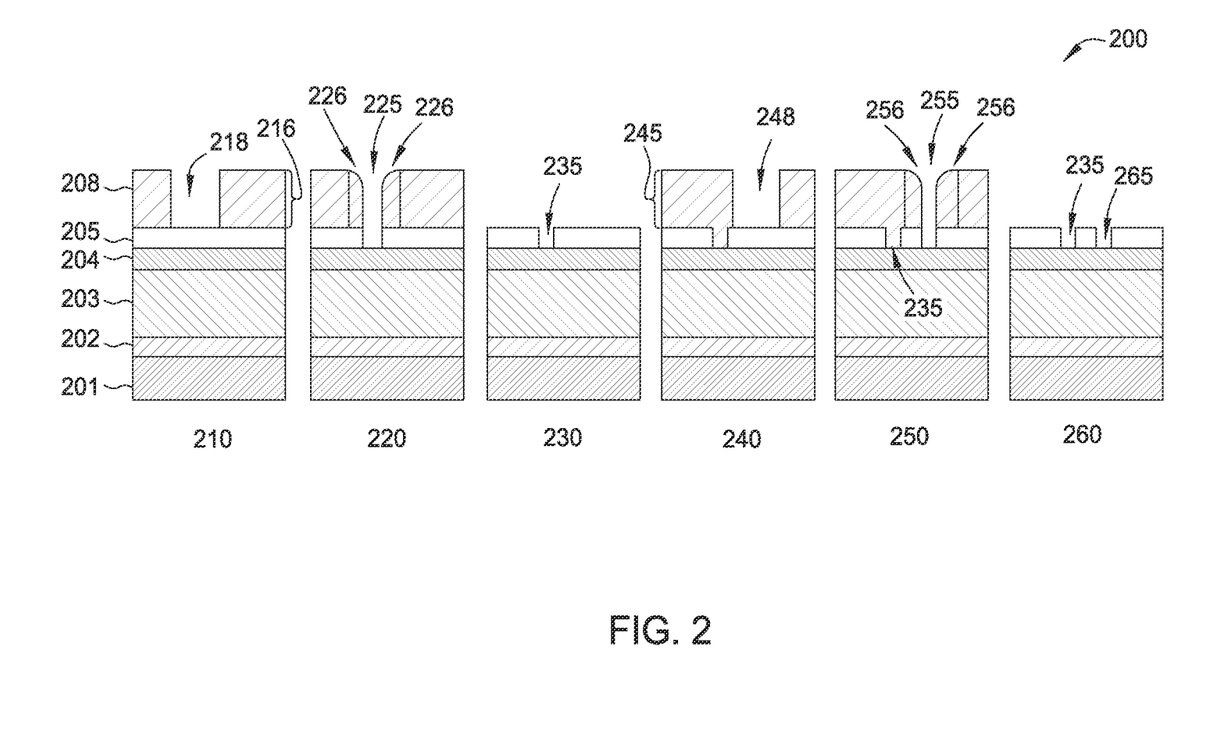
FIG. 2 depicts an embodiment herein for multi-patterning a hardmask layer using a single-layer etch.

For each patterning step of the same hardmask layer, the prior tri-layer must be stripped from the substrate, the substrate must be cleaned, and then a new tri-layer must be applied. The operations described in FIG. 1 require the deposition of 6 layers (two tri-layers) to planarize, or optically flatten the wafer in order to maintain focus and to optically isolate the memorization layer 105 for the lithography operation when forming the openings 135 and 165 seen in the sixth snapshot. The embodiments hereinafter discussed provide apparatus and methods for preparing multiple openings in multiple patterning steps in a hardmask layer without the need to optically planarize or isolate the patterned hardmask layer during subsequent lithography steps to further pattern the hardmask layer. FIG. 2 depicts a new cycle 200 for multi-patterning an optically matched hardmask layer, in accordance with one embodiment herein.

The new cycle 200, as shown in FIG. 2, includes snapshots 210 through 260 for a portion of a substrate by which two openings 235 and 265 are separately formed in the hardmask layer 205 in two different lithography steps. In the example, a substrate includes a low $\mathcal{K}$ material 201 having a TiN metal hardmask 202 thereon, and a first optical planarization layer 203 (bottom layer) and an antireflective coating/ashing barrier 204 (middle layer). A "memorization" hardmask layer 205 (a hardmask layer formed thereover) is disposed on a top surface of the ARC/ashing barrier 204. The ARC/ashing barrier 204 may comprise a thin film for with both antireflective properties (at $\lambda=193$ nm) and etch stopping and ashing barrier properties for the etch and PR strip performed on the hardmask layer 205. The ARC/ashing barrier 204 may be formed from a Si based material. The ARC/ashing barrier 204 may alternatively be formed from a aluminum nitride (AlN), AlON, SiN, TiN or other robust material having antireflective properties, etch stopping properties, ashing barrier properties and can also be selectively removed. For example, the ARC/ashing barrier 204 may be formed by depositing an AlN layer over the surface of the substrate. The AlN layer may be formed by physical vapor deposition, chemical vapor deposition, atomic layer deposition, or by other suitable method. Disposed on the top of the hardmask layer 205 is only a photo-resist layer 208, such that the photo-resist layer 208 at least partially is in direct contact with hardmask layer 205.

The hardmask layer 205 may be a $SiO_xN_yC_z:H_w$ film having a variety of values of w, x, y and z ranging from 0% to 100%. In some cases, the SiON, SiOC or SiONC type films may be doped with hydrogen (H), as noted by the ":H" nomenclature used herein. The hardmask layer 205 composition is tuned to match the n and $\mathcal{K}$ values of the photo-resist layer 208 at the exposure wavelength for the lithographic patterning thereof, typically 193 nm. $SiO_xN_y$ films, formed by Physical Vapor Deposition from a silicon target, have a refractive index n ranging between 1.5 to 2.5 and an extinction coefficient $\mathcal{K}$ of around 0 to 0.3 at exposure wavelength 193 nm. The termination of the $SiO_xN_yC_z:H_w$ film may affect the properties of next layer formed thereon, i.e. the photo-resist layer 208. Therefore, in some configurations, it is desirable to adjust the composition and/or properties of the material in the hardmask layer 205 found at the interface of the hardmask layer 205 and the photo-resist layer 208, or termination region. The termination region of the hardmask layer 205, which is at the interface of the hardmask layer 205 and the photo-resist layer 208, may be only a few angstroms or monolayers thick. In one example, it may be desirable to tune the hydrogen (H) and/or nitrogen (N) concentration in the interface region by turning off the flows of nitrogen and/or hydrogen bearing gas(es) during the latter stages of the deposition process, so that the concentration of H and/or N in the termination region, is at least less than the concentration of H and/or N within rest of the formed layer. In one example, the concentration of hydrogen at the surface of the hardmask layer 205 is less than the average hydrogen concentration through a thickness of the deposited hardmask layer 205 and/or the concentration of nitrogen at the surface of the hardmask layer 205 is less than the average nitrogen concentration through the thickness of the deposited hardmask layer 205. Bombarding the surface of the deposited hardmask layer 205 with gas atoms, such as ionized argon (Ar) gas, may be used to alter the composition (e.g., H and/or N concentration) or crystal structure of the formed hardmask layer 205. The bombardment process may be performed by forming a plasma over a surface of the substrate and then biasing the substrate, or substrate support that the substrate is resting on, so that ionized gas atoms in the plasma bombard the surface of the substrate. In one configuration, the bombardment process is performed as a last step in the formation of the hardmask layer 205, so as to alter and/or adjust the surface energy of the film and wetting angle properties of the surface. Therefore, by use of one of the processes discussed above, the properties of the termination region and surface of the hardmask layer 205 can be adjusted so that the surface is hydrophobic or at least more hydrophobic than a uniform composition type hardmask layer and/or an "as-deposited" hardmask layer. Additionally, by use of at least one of these processes, the hardmask layer 205 may be made inert and stable so as not to poison the photo-resist layer 208 formed thereon. As the stoichiometry of the film is not very dependent on deposition temperature, low temperature deposition is possible.

Additionally, the ions bombarding the surface of the deposited hardmask layer 205 may also be biased to the substrate to promote a smooth surface of the substrate prior to disposing the photo-resist layer 208 thereon. The stronger the bias of the ions to the substrate, the denser and smoother the substrate surface becomes. The bombardment process can be used to smooth the surface of the hardmask layer 205, so that the surface does not have significant roughness or macroscopic features, such as small bumps or divots, which may scatter the lithography wavelengths when patterning the photo-resist. Advantageously, the pattern in the photo-resist layer 208 is tightly controlled prior to etching critical dimensions in the hardmask layer 205.

In some embodiments, the properties of the hardmask layer 205 are adjusted so that during the alignment of the lithographic pattern phase of the patterning sequence, the previous alignment marks or alignment patterns formed in the hardmask layer 205 are made distinguishable, at the alignment inspection wavelength(s), from the photo-resist layer disposed over the hardmask layer 205, which is typically 530 or 630 nm. The refractive index n or extinction coefficient $\mathcal{K}$ of the hardmask layer 205 may be different from the photo-resist layer 208 at the alignment wavelength (530 nm/630 nm), while still similar at the lithographic exposure wavelength (193 nm). The extinction coefficient can be sensitive to the wavelength. Therefore, the hardmask layer 205 may be doped with hydrogen (H), boron (B), or potassium (K). The dopant atoms may be added to the target or process gas(es) may be used during the deposition process to adjust the optical properties of the hardmask layer 205 at only the desired wavelength. Therefore the hardmask layer 205 may be tuned to substantially match the refractive index n and extinction coefficient $\mathcal{K}$ at the lithographic wavelength of 193 nm, while simultaneously having a different refractive index n or extinction coefficient $\mathcal{K}$ at an alignment wavelength of 530 nm or 630 nm. Alternately, a dye may be added to the hardmask layer 295 to make the hardmask layer 205 distinguishable from the photo-resist layer 245 at the lithography wavelength of 193 nm, but not at the alignment wavelength of 530 nm or 630 nm.

As described herein, the optical properties of the hardmask and resist are sufficiently similar to enable the hardmask to repeatedly be patterned using only a single layer of resist thereon. To be optically planar, the reflectivity at the interface of the hardmask and resist need be at most 1-2%. Because the reflectivity is a difference function, one must match n & $\mathcal{K}$ to enable no reflection at an interface of two materials; simply matching n is not sufficient. For a matched hardmask layer 205, relative to the photo-resist layer 208, the n & $\mathcal{K}$ sufficiently match such that the Fresnel equations predict <2% reflectivity. However, in the most advanced lithography, the Fresnel equations should predict <0.5% reflectivity. The difference in the n & $\mathcal{K}$ values for a hardmask layer and a photo-resist provide an indicator of a sufficiently match hardmask to a resist. A sufficiently matched hardmask layer 205 to photo-resist layer 208 has a $\mathcal{K}$ value within ±0.01 and an n value within ±0.01.

To incorporate nitrogen or hydrogen in the sputtered Si, the level of oxygen present in the sputtering chamber must be very low. Even at $O_2/N_2$ ratio of 1/10, the "10%" value for $O_2$ is enough to satisfy, i.e., bond at the exclusion of nitrogen to the dangling Si bonds (bond sites) in the PVD deposited silicon. For example, for 100 atoms of silicon dangling bonds (bond sites), introducing 100 atoms of $O_2$ and 10,000 atoms of $N_2$, the 100 atoms of $O_2$ will bond with the Si dangling bonds to the exclusion of the $N_2$. Thus, little nitrogen will be incorporated into the film. Therefore, to tune the refractive index n by the $O_2/N_2$ ratio of the film, can be tuned by starving the $O_2$ gas flow during the deposition process.

In the first snapshot of FIG. 2, 193 nm wavelength "ultra violet light" (electromagnetic energy) is used to expose a pattern onto the photo-resist layer 208, which is developed to form aperture 218. The lithography tool simultaneously can print 1 billion such features. However, as chips become more dense, chip designs have called for billions more features. To accomplish this, the lithography tool exposes only a part of the total features to be formed in or on the surface in a single operation. Patterns for the remaining features are aligned on the substrate during subsequent operations. The remaining features are then formed on or in the layer in the subsequent operations. Thus the lithographic exposing of 3 billion features may require at least 3 cycles.

The aperture 218 is part of a larger design pattern to be formed in the hardmask layer 205. The pattern aperture 218 in the photo-resist layer 208 exposes a top surface of the hardmask layer 205 within the aperture 218. The hardmask layer 205 has a refractive index (n) and an extinction coefficient ($\mathcal{K}$) matched or nearly matched to the photo-resist layer 208. By matching or nearly matching the optical properties n and $\mathcal{K}$ of the photo-resist layer 208 and hardmask layer 205, the interface of the photo-resist layer 208 and the hardmask layer 205 does not, or at least only minimally, reflects or refracts the ultra violet light of the lithography wavelength, and thus the interface becomes "invisible" to the lithography exposure wavelength. As a result, the photo-resist layer 208 and the hardmask layer 205 together appear optically flattened or planarized to the ultra violet exposure wavelength of 193 nm, despite the presence of three-dimensional features at the interface thereof, and, without the need to create an optical planarization layer for each patterning step of an underlying hardmask. In one embodiment the photo-resist layer 208 and the hardmask layer 205 has a refractive index n=1.6 and an extinction coefficient $\mathcal{K}$ =0.05. As a result, the exposure electromagnetic energy will not reflect or refract at the physical interface of the hardmask layer 205 and the overlying photo-resist layer 208.

In the second snapshot 220, an optional conformal polymer 226 was deposited on the exposed surfaces of the photo-resist layer 208 and the hardmask layer 205 and an etching process is performed thereon to create opening 225. 193 nm wavelength lithography has practical limitations on the size (width) of the features, such as trenches, it can form in the photo-resist layer 208. The deposition of the conformal polymer enables narrower features than capable by the 193 nm lithography alone. Alternatively, smaller wavelengths for the lithography may be utilized to create a pattern of the desired width. In such an instance, the conformal polymer would not be used.

In the third snapshot 230, after etching the underlying hardmask layer 205 to form first opening 235, the conformal polymer sidewalls 226 and the photo-resist layer 208 were removed by an ashing operation without significantly changing the refractive index (n) or the extinction coefficient ($\mathcal{K}$) value for the hardmask layer 205. In one embodiment, remote $O_2$ plasma is used to ash the photo-resist layer 208. Alternatively, a mixture of hydrogen containing gasses and nitrogen containing gasses such as $H_2$ and $N_2$ are used to ash the photo-resist layer 208, optionally after being activated in a remote plasma source. Opening 235 represents only a portion of the total pattern required to be created in the hardmask layer 205.

Figure 5:
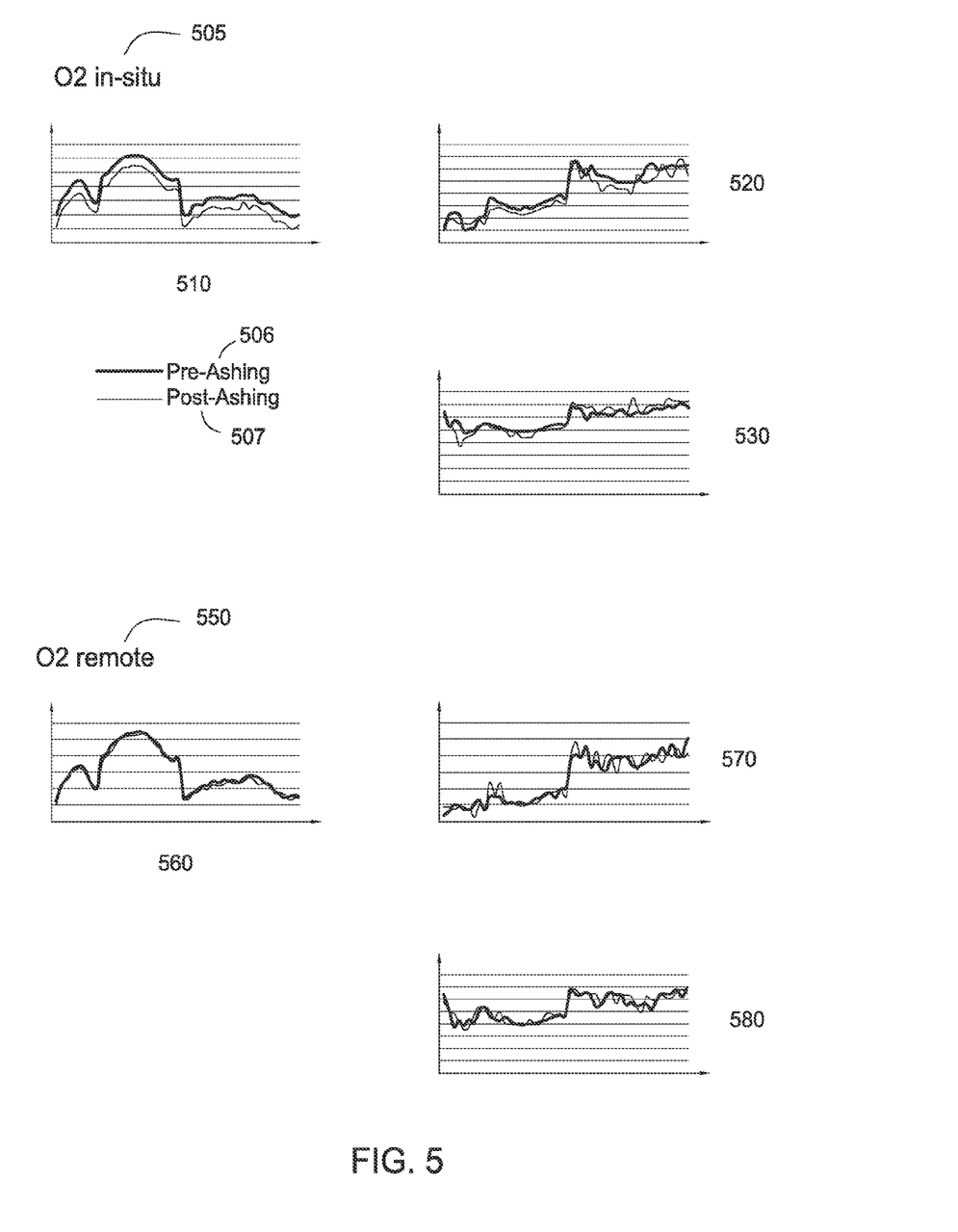
FIG. 5 depicts the changes to a hardmask layer from ashing with in-situ and remote plasma activated $O_2$.

The ashing may be performed with a remote plasma source or in-situ. To support multiple ashing operations, changes in the refractive index (n) and the extinction coefficient ($\mathcal{K}$) value for the hardmask layer 205 must be minimal. FIG. 5 depicts the changes in the hardmask layer 205 for ashing with an $O_2$ plasma formed in-situ 505 and $O_2$ plasma formed remotely 550.

The three graphical representations of the effect of $O_2$ plasma formed in-situ 505, depict memorization layer (i.e., hardmask layer or hardmask layer) thickness across the layer in graph 510, the refractive index of the memorization layer across the layer in graph 520, and the extinction coefficient of the memorization layer across the layer in graph 530. The thickness, refractive index and extinction coefficient, are plotted on the y-axis for graphs 510 through 530. Plotted along the x-axis are 49 (forty nine) measured values at sample positions located along concentric circles from the center to the outside edge of the substrate. The measurements are made pre-ashing 506 and post ashing 507. As shown in the graph 510, the thickness of the memorization layer changes from pre-ashing 506 to post ashing 507. As shown in the graph 520, the refractive index of the memorization layer changes from pre-ashing 506 to post ashing 507. And as shown in the graph 530, the extinction coefficient of the memorization layer changes from pre-ashing 506 to post ashing 507. Ashing using an $O_2$ plasma formed in-situ showed small thickness change, and a minimal drop in the refractive index in the SiON as the $O_2$ content increased, which may result by oxidation thereof.

The three graphical representations of the effect of $O_2$ plasma formed remotely 550 as the ashing medium, depict memorization thickness across the layer in graph 560, the refractive index of the memorization layer across the layer in graph 570, and the extinction coefficient of the memorization layer across the layer in graph 580. Again, the thickness, refractive index and extinction coefficient, are plotted on the y-axis for graphs 560 through 580. Plotted along the x-axis are 49 measured values at sample positions located along concentric circles from the center to the outside edge of the substrate. As shown in the graph 560, the thickness of the memorization layer is substantially unchanged from pre-ashing 506 to post ashing 507. As shown in the graph 570, the refractive index of the memorization layer is substantially unchanged from pre-ashing 506 to post ashing 507. And as shown in the graph 580, the extinction coefficient of the memorization layer is substantially unchanged from pre-ashing 506 to post ashing 507.

Figure 6:
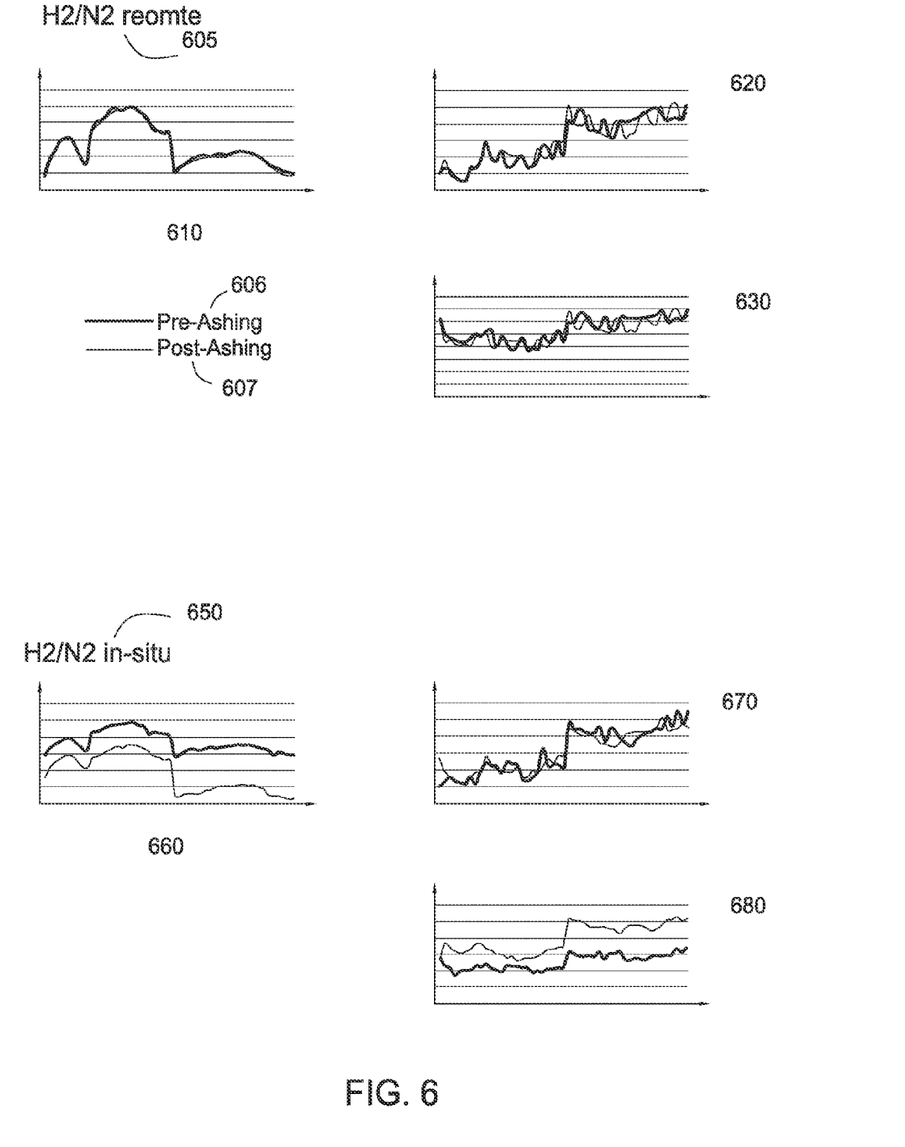
FIG. 6 depicts the changes to a hardmask layer from ashing with in-situ and remote plasma activated $H_2/N_2$.

FIG. 6 depicts the changes in the hardmask layer 205 for ashing with a plasma mixture of hydrogen ($H_2$) containing gasses and nitrogen ($N_2$) containing gasses ($H_2/N_2$) formed in-situ 605 and formed remotely 650.

The three graphical representations of the effect of $H_2/N_2$ plasma formed remotely 605 as the ashing medium, depict memorization thickness across the layer in graph 610, the refractive index of the memorization layer across the layer in graph 620, and the extinction coefficient of the memorization layer across the layer in graph 630 is the same manner as FIG. 5. The thickness, refractive index and extinction coefficient, are plotted on the y-axis for graphs 610 through 630. Plotted along the x-axis are 49 measured values at sample positions located along concentric circles from the center to the outside edge of the substrate. The measurements are made pre-ashing 606 and post ashing 607. As shown in the graph 610, the thickness of the memorization layer is substantially unchanged from pre-ashing 606 to post ashing 607. As shown in the graph 620, the refractive index of the memorization layer is substantially unchanged from pre-ashing 606 to post ashing 607. And as shown in the graph 630, the extinction coefficient of the memorization layer is substantially unchanged from pre-ashing 606 to post ashing 607.

The three graphical representations of the effect of $H_2/N_2$ plasma formed in-situ 650, depict memorization thickness across the layer in graph 660, the refractive index of the memorization layer across the layer in graph 670, and the extinction coefficient of the memorization layer across the layer in graph 680. Again, the thickness, refractive index and extinction coefficient, are plotted on the y-axis for graphs 660 through 680. Plotted along the x-axis are 49 measured values at sample positions located along concentric circles from the center to the outside edge of the substrate. As shown in the graph 660, the thickness of the memorization layer changes from pre-ashing 606 to post ashing 607. As shown in the graph 670, the refractive index of the memorization layer changes from pre-ashing 606 to post ashing 607. And as shown in the graph 680, the extinction coefficient of the memorization layer changes from pre-ashing 606 to post ashing 607. Ashing using an $H_2/N_2$ plasma formed in-situ showed a certain amount of increase in the extinction coefficient.

Therefore for an $O_2$ gas, or an $H_2/N_2$ gas, used as an ashing medium, forming a plasma remotely for ashing the resist from the memorization layer (hardmask layer) 205, causes significantly less change in the refractive index (n) and the extinction coefficient ($\mathcal{K}$) value of the hardmask layer 205 than using a plasma formed in-situ. This allows for multiple sequences of lithography, etch, and strip of a resist to form features in a hardmask, without suffering optical topography or reflectivity variations.

Referring again to FIG. 2 at snapshot 240, to enable a second patterning of the hardmask layer 205, a photo-resist 245 is deposited and developed on the hardmask layer 205 for the purpose of patterning the remaining openings in the hardmask layer 205. Prior to each lithography operation, the patterns of the openings are aligned on the substrate with the patterns etched in the hardmask layer 205 using a 530 nm or 630 nm wavelength. The hardmask layer 205 has a refractive index (n) and an extinction coefficient ($\mathcal{K}$) matching the photo-resist layer 245 at the lithography wavelength of 193 nm, the interface of the hardmask layer 205 and the photo-resist layer 245 is optically indistinguishable to the exposure electromagnetic energy. However, the hardmask layer 205 has a refractive index (n) and an extinction coefficient ($\mathcal{K}$) which is different from the photo-resist layer 245 at a wavelength of about 530 nm or about 630 nm to allow the alignment of the lithography pattern. Thus, the n and $\mathcal{K}$ of the hardmask layer 205 is indistinguishable from the n and $\mathcal{K}$ of the photo-resist 245 at the wavelength of 193 nm while distinguishable at the wavelength of 530 nm or 630 nm. This removes the need to deposit additional material on the hardmask layer 205 as was previously required to optically planarize or shield the previously etched features from exposure to the lithography electromagnetic energy. That is, the deposition of the tri-layer containing the second optical planarization layer 106 and the silicon anti-reflective layer 107, as shown in FIG. 1, is no longer required. Additionally, since there are no, or acceptably minimal, interface reflections between the hardmask layer 205 and the overlying resist at the lithographic wavelength of 193 nm, optical proximity correction may not be needed for correcting the topology in a following lithographic operation, and applicants have accomplished patterning with the optically matched resist and memorization layer without using optical proximity correction.

In the fourth snapshot 240, a pattern 248 has been lithographically exposed and developed in the photo-resist 245. The pattern 248 is part of a larger design pattern to be formed in the hardmask layer 205. A conformal polymer is deposited on the exposed surfaces of the photo-resist layer 208 and the hardmask layer 205 prior to an etch process. The deposition of the conformal polymer may alternatively occur during the etching of the hardmask layer 205.

In the fifth snapshot 250, an opening 265 in the hardmask layer 205 is shown after an etch operation. After etching, the conformal polymer is visible on the sidewalls 256 of the pattern 248. In a sixth snapshot 260, the conformal polymer sidewalls 256 and the photo-resist layer 245 were removed by an ashing operation. The ashing operation is performed in a manner which does not meaningfully change the refractive index (n) or the extinction coefficient ($\mathcal{K}$) value for the hardmask layer 205. In an integrated circuit fabrication process, substrates may be lithographically processed multiple times. However, the multiple lithographic cycles of etching and ashing performed on the same hardmask layer 205 does not significantly alter the refractive index (n) or the extinction coefficient ($\mathcal{K}$) value of the hardmask layer 205. As a result, the need to deposit an optical planarization layer and a silicon anti-reflective layer and use optical proximity corrections to form openings 235, 265 is negated.

Through matching both the n (refractive index) and the $\mathcal{K}$ value for the hardmask to the photo-resists at the 193 nm wavelength, a hardmask, $SiO_xN_yC_z$, is formed. In another embodiment, the hardmask is $SiO_2$. Again, this involves tuning the n and $\mathcal{K}$ in the hardmask to match the n and $\mathcal{K}$ of the photo-resist (soft mask) at the 193 nm wavelength while distinguishing them at the 530 nm or 630 nm wavelength.

The prior art chemical vapor deposition (CVD) process used to form SiON film layers requires higher temperatures, and yields a film having a higher $\mathcal{K}$ value because hydrogen becomes incorporated into the film from the Silane precursor. Additionally, the prior art film layers typically contain N—H or amine bonds that form acids which interfere with the photo-resist and may cause byproducts, i.e. scumming, which may need to be removed. The hydrogen forms Si—H which absorbs the 193 nm wavelength and therefore increases the $\mathcal{K}$ value. This is especially true at the low deposition temperatures required to meet the thermal budget of the SOC film (typically <200 C). Thus, using CVD, the extinction coefficient ($\mathcal{K}$), or the absorption of electromagnetic energy, of the SiON layer becomes too high. Applicants disclose herein that a Physical Vapor deposition (PVD) formed $SiO_xN_yC_z$ film, or layer, may be formed which is tunable to the n and $\mathcal{K}$ values of the relevant resist. Additionally, the hardmask layer may be formed well below 200 C, and acceptable optically tuned hardmask layers have been deposited around 20 to 25 C by sputtering silicon in a reactive atmosphere.

However, silicon is difficult to sputter. Usually, when sputtering a dielectric layer, the surface will accumulate charges leading up to arcing and the ejection of particles of the target. The use of a pulse DC allows fast switching from negative, for sputtering, to positive, for sweeping or charge scrubbing, (neutralizing all the charges on the dielectric surface) of the target.

Figure 3:
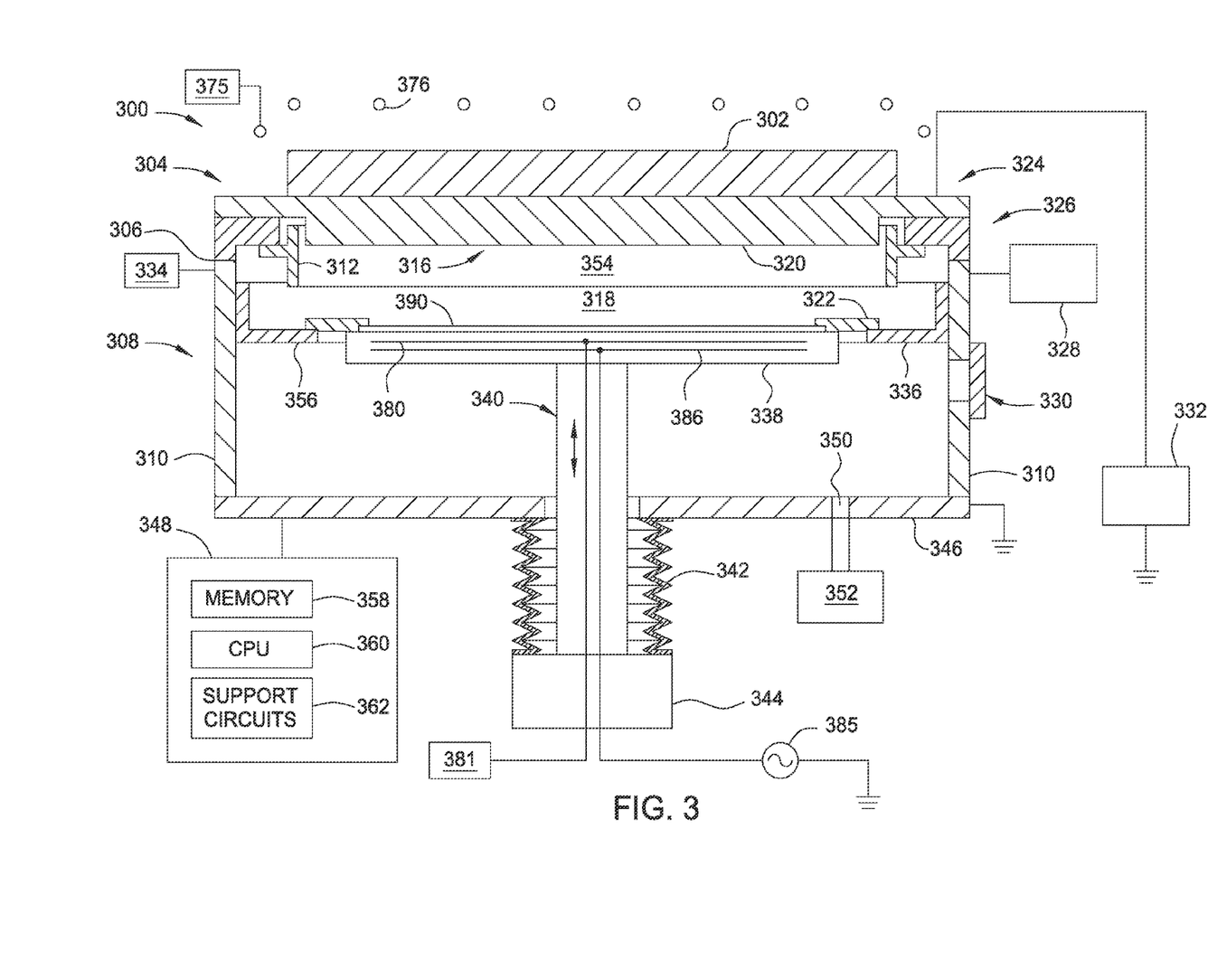
FIG. 3 depicts a cross sectional view of one embodiment of a process chamber capable of forming a hardmask layer.

FIG. 3 illustrates an exemplary physical vapor deposition (PVD) process chamber 300 (e.g., a sputter process chamber) suitable for sputter depositing materials. One example of the process chamber that may be adapted to form the $SiO_xN_yC_z$ film layer is a PVD process chamber, available from Applied Materials, Inc., located in Santa Clara, Calif. It is contemplated that other sputter process chambers, including those from other manufactures, may be adapted to practice the present invention.

The process chamber 300 includes a chamber body 308 having a processing volume 318 defined therein. The chamber body 308 has sidewalls 310 and a bottom 346. The dimensions of the chamber body 308 and related components of the process chamber 300 are not limited and generally are proportionally larger than the size of the substrate 390 to be processed. Any suitable substrate size may be processed. Examples of suitable substrate sizes include substrate with 200 mm diameter, 300 mm diameter or 450 mm diameter.

A chamber lid assembly 304 is mounted on the top of the chamber body 308. The chamber body 308 may be fabricated from aluminum or other suitable materials. A substrate access port 330 is formed through the sidewall 310 of the chamber body 308, facilitating the transfer of a substrate 390 into and out of the process chamber 300. The access port 330 may be coupled to a transfer chamber and/or other chambers of a substrate processing system.

A water vapor generating (WVG) system 334 is coupled to the processing volume 318 defined in the process chamber 300. The WVG system 334 generates ultra-high purity water vapor by means of a catalytic reaction of $O_2$ and $H_2$. Alternatively, the WVG system 334 may also generate water vapor by directly vaporizing water ($H_2O$) into water vapor as needed. The WVG system 334 has a catalyst-lined reactor or a catalyst cartridge in which water vapor is generated by means of a chemical reaction. The catalyst may include a metal or alloy, such as palladium, platinum, nickel, combinations thereof and alloys thereof. While water vapor is usually generated by flowing $H_2$ and $O_2$ into the reactor, the $O_2$ may be supplemented or substituted with another oxygen source compound, such as NO, $N_2O$, $NO_2$, $N_2O_5$, $H_2O_2$ or $O_3$. In one embodiment, $H_2$ and $N_2O$ are utilized to form a water vapor as needed. The ultra-high purity water is ideal for providing $H_2O$ into the processing volume 318 for forming plasma having $O_2$ and $H_2$ ions.

A gas source 328 is coupled to the chamber body 308 to supply process gases into the processing volume 318. In one embodiment, process gases may include inert gases, non-reactive gases, and reactive gases if necessary. Examples of process gases that may be provided by the gas source 328 include, but not limited to, argon gas (Ar), helium (He), neon gas (Ne), krypton (Kr), xenon (Xe), nitrogen gas ($N_2$), oxygen gas ($O_2$), hydrogen gas ($H_2$), $H_2O$ (in vapor form from the WVG system 334), forming gas ($N_2+H_2$), ammonia (NH3), methane ($CH_4$), carbon monoxide (CO), and/or carbon dioxide ($CO_2$), among others.

A pumping port 350 is formed through the bottom 346 of the chamber body 308. A pumping device 352 is coupled to the processing volume 318 to evacuate and control the pressure therein. A pumping system and chamber cooling design enables high base vacuum (1E-8 Torr or less) and low rate-of-rise (1,000 mTorr/min) at temperatures suited to thermal budget needs, e.g., −25 C to +500 C. The pumping system is designed to provide precise control of process pressure which is a critical parameter for RI control and tuning.

The lid assembly 304 generally includes a target 320 and a ground shield assembly 326 coupled thereto. The target 320 provides a material source that can be sputtered and deposited onto the surface of the substrate 390 during a PVD process. Target 320 serves as the cathode of the plasma circuit during DC sputtering.

The target 320 or target plate may be fabricated from a material utilized for the deposition layer, or elements of the deposition layer to be formed in the chamber. A high voltage power supply, such as a power source 332, is connected to the target 320 to facilitate sputtering materials from the target 320. In one embodiment, the target 320 may be fabricated from a material containing silicon (Si), titanium (Ti) metal, tantalum metal (Ta), hafnium (Hf), tungsten (W) metal, cobalt (Co), nickel (Ni), copper (Cu), aluminum (Al), alloys thereof, combinations thereof, or the like. Additionally, the electron emission from the target during processing may be controlled by n-type or p-type doping of the target. The target may be doped with a conducting element such as Boron (B). The target material may have a monocrystalline versus a polycrystalline structure. For example, the target may include Si in which the crystal lattice of the entire Si target is a single crystal. In an exemplary embodiment depicted herein, the target may be fabricated from an intrinsic Si, or doped electrically conductive Si, or specific composition $SiO_xN_yC_z:H_w$ composite target. In one embodiment, the target is 99.999% pure Si doped with Boron to about $1 \times 10^{18}$ atoms per $cm^2$.

The target 320 generally includes a peripheral portion 324 and a central portion 316. The peripheral portion 324 is disposed over the sidewalls 310 of the chamber. The central portion 316 of the target 320 may have a curvature surface slightly extending towards the surface of the substrate 390 disposed on a substrate support 338. The spacing between the target 320 and the substrate support 338 is maintained between about 50 mm and about 350 mm. It is noted that the dimension, shape, materials, configuration and diameter of the target 320 may be varied for specific process or substrate requirements. In one embodiment, the target 320 may further include a backing plate having a central portion bonded and/or fabricated by a material desired to be sputtered onto the substrate surface. The target 320 may also include adjacent tiles or segmented materials that together form the target.

The lid assembly 304 may further comprise a full face erosion magnetron cathode 302 mounted above the target 320 which enhances efficient sputtering materials from the target 320 during processing. The full face erosion magnetron cathode 321 allows easy and fast process control and tailored film properties while ensuring consistent target erosion and uniform deposition of $SiO_xN_yC_z:H_w$ film across the wafer for a variety of values of w, x, y and z ranging from 0% to 100%. Examples of the magnetron assembly include a linear magnetron, a serpentine magnetron, a spiral magnetron, a double-digitated magnetron, a rectangularized spiral magnetron, among others.

The ground shield assembly 326 of the lid assembly 304 includes a ground frame 306 and a ground shield 312. The ground shield assembly 326 may also include other chamber shield member, target shield member, dark space shield, and dark space shield frame. The ground shield 312 is coupled to the peripheral portion 324 by the ground frame 306 defining an upper processing region 354 below the central portion of the target 320 in the processing volume 318. The ground frame 306 electrically insulates the ground shield 312 from the target 320 while providing a ground path to the chamber body 308 of the process chamber 300 through the sidewalls 310. The ground shield 312 constrains plasma generated during processing within the upper processing region 354 and dislodges target source material from the confined central portion 316 of the target 320, thereby allowing the dislodged target source to be mainly deposited on the substrate surface rather than chamber sidewalls 310. In one embodiment, the ground shield 312 may be formed by one or more work-piece fragments and/or a number of these pieces bonding by processes known in the art, such as welding, gluing, high pressure compression, etc.

A shaft 340 extending through the bottom 346 of the chamber body 308 couples to a lift mechanism 344. The lift mechanism 344 is configured to move the substrate support 338 between a lower transfer position and an upper processing position. A bellows 342 circumscribes the shaft 340 and coupled to the substrate support 338 to provide a flexible seal there between, thereby maintaining vacuum integrity of the chamber processing volume 318.

The substrate support 338 may be an electro-static chuck and have an electrode 380. The electro-static chuck (ESC) 338 uses the attraction of opposite charges to hold both insulating and conducting substrates 390 for a lithography processes and is powered by DC power supply 381. The ESC 338 comprises an electrode embedded within a dielectric body. The DC power supply 381 may provide a DC chucking voltage of about 200 to about 2000 volts to the electrode. The DC power supply 381 may also include a system controller for controlling the operation of the electrode 380 by directing a DC current to the electrode for chucking and de-chucking the substrate 390.

The temperature of the PVD process may be kept below the temperature at which organic films deposited beneath the hardmask layer 205 become volatile. For example, temperature may be less than about 250 Celsius and have about a 50 Celsius margin to prevent the organic films below the hardmask layer 205 from gassing out and contaminating the chamber. The ESC 338. The ESC 338 performs in the temperature range required by the thermal budget of the device integration requirements. For example; Detachable ESC 338 (DTESC) for minus 25 C to 100 C temperature range, Mid-Temp ESC 338 (MTESC) for 100 C to 200 C temperature range, High Temperature or High Temperature Biasable or High Temperature High Uniformity ESC 338 (HTESC or HTBESC or HTHUESC) for temperatures ranging from 200 C to 500 C that ensures fast and uniform heating up of wafers.

After the process gas is introduced into the PVD chamber 300, the gas is energized to form plasma. An antenna 376, such as one or more inductor coils, may be provided adjacent the PVD chamber 300. An antenna power supply 375 may power the antenna 376 to inductively couple energy, such as RF energy, to the process gas to form plasma in a process zone in the PVD chamber 300. Alternatively, or in addition, process electrodes comprising a cathode below the substrate 390 and an anode above the substrate 390 may be used to couple RF power to generate plasma. A controller that also controls the operation of other components in the PVD chamber 300 may control the operation of the power supply 375.

A shadow frame 322 is disposed on the periphery region of the substrate support 338 and is configured to confine deposition of source material sputtered from the target 320 to a desired portion of the substrate surface. A chamber shield 336 may be disposed on the inner wall of the chamber body 308 and have a lip 356 extending inward to the processing volume 318 configured to support the shadow frame 322 disposed around the substrate support 338. As the substrate support 338 is raised to the upper position for processing, an outer edge of the substrate 314 disposed on the substrate support 338 is engaged by the shadow frame 322 and the shadow frame 322 is lifted up and spaced away from the chamber shield 336. When the substrate support 338 is lowered to the transfer position adjacent to the substrate transfer access port 330, the shadow frame 322 is set back on the chamber shield 336. Lift pins (not shown) are selectively moved through the substrate support 338 to list the substrate 390 above the substrate support 338 to facilitate access to the substrate 390 by a transfer robot or other suitable transfer mechanism.

A controller 348 is coupled to the process chamber 300. The controller 348 includes a central processing unit (CPU) 360, a memory 358, and support circuits 362. The controller 348 is utilized to control the process sequence, regulating the gas flows from the gas source 328 into the process chamber 300 and controlling ion bombardment of the target 320. The CPU 360 may be of any form of a general purpose computer processor that can be used in an industrial setting. The software routines can be stored in the memory 358, such as random access memory, read only memory, floppy or hard disk drive, or other form of digital storage. The support circuits 362 are conventionally coupled to the CPU 360 and may comprise cache, clock circuits, input/output subsystems, power supplies, and the like. The software routines, when executed by the CPU 360, transform the CPU into a specific purpose computer (controller) 348 that controls the process chamber 300 such that the processes are performed in accordance with the present invention. The software routines may also be stored and/or executed by a second controller (not shown) that is located remotely from the PVD chamber 300.

During processing, material is sputtered from the target 320 and deposited on the surface of the substrate 390. The target 320 and the substrate support 338 are biased relative to each other, and/or relative to ground, by the power source 332 to maintain a plasma formed from the process gases supplied by the gas source 328. The ions from the plasma are accelerated toward and strike the target 320, causing target material to be dislodged from the target 320. The dislodged target material and reactive process gases together form a layer on the substrate 390 with desired compositions. RF, DC or fast switching pulsed DC power supplies or combinations thereof provide tunable target bias for precise control of sputtering composition and deposition rates for the $SiO_xN_yC_z:H_w$ material.

In some embodiments, it is also desirable to separately apply a bias to the substrate during different phases of the $SiO_xN_yC_z:H_w$ layer deposition process. Therefore, a bias may be provided to a bias electrode 386 (or chuck electrode 380) in the substrate support 338 from a source 385 (e.g., DC and/or RF source), so that the substrate 390 will be bombarded with ions formed in the plasma during one or more phase of the deposition process. Biasing the electrode can be used to smooth the surface of the substrate and increase the hydrophobicity for the surface of the substrate. In some process examples, the bias is applied to the substrate after the $SiO_xN_yC_z:H_w$ film deposition process has been performed. Alternately, in some process examples, the bias is applied during the $SiO_xN_yC_z:H_w$ film deposition process. Thus, when the substrate bias is maintained throughout the deposition process the bombarding atoms add kinetic energy to the depositing material found at the surface of the substrate. For example, between about 50 Watts and about 1100 Watts of energy may be used to bias ions to the substrate to form a smooth dense film. A larger bias drives the ions with greater energy to the substrate surface. For example, a post treatment process may use an argon (Ar) containing gas and smooth the substrate film by providing bias energy, such between about 200-1100 Watts, to direct the ions at the substrate surface of the $SiO_xN_yC_z:H_w$ film, i.e. the hardmask layer 205. The smooth film surface for the hardmask layer advantageously prevents light scattering on bumpy surfaces for the lithography which may affect the quality of the features formed in the photo-resist layer. In another example, a post treatment process may use a process gas that includes argon (Ar) gas. The post treatment may make the surface of the $SiO_xN_yC_z:H_w$ film more stable and hydrophobic.

The combination of the unique hardware and process produces an optically matched, to a resist to be formed thereon, $SiO_xN_yC_z:H_w$. The $SiO_xN_yC_z:H_w$ film refractive index (n) and extinction coefficient ($\mathcal{K}$) are tunable by adjusting gas flows and the resultant film stoichiometry. A target is poisoned when the surface is no longer conductive. So, poison mode sputtering occurs when the reactive species in the gas atmosphere at the target surface is specifically rich in reactive species that a dielectric layer is formed across the face of the target and the target behaves electrically like a dielectric and not a conductor or semiconductor. H and/or O and/or N and/or C containing gases can react on and poison the surface of the target to create the desired $SiO_xN_yC_z:H_w$ stoichiometry to enable the combination of optical "invisibility" and etch selectivity best suited for the device needs. In addition, methane ($CH_4$), carbon monoxide (CO), hydrogen ($H_2$), or carbon dioxide ($CO_2$) can also be used as a poisoning gas to achieve more tunability of the n and $\mathcal{K}$ values along with a desired etch selectivity. For example, $H_2$ may be used to form a thin film or a SiH monolayer in order to increase the light absorption $\mathcal{K}$ without increasing the reflectivity n due to the layer tenuity. Thus, the H containing gas may form a light absorption layer.

The hardware may also include a gas box. Mixing gas in a gas box before coming into the chamber is one way to ensure a homogenous gas mixture of the various process gases for uniform target poisoning. The gas box would mix H$_2$ with N$_2$ for fine tuning the $\mathcal{K}$. O$_2$ would be added to the NH mixture (more stable and less dangerous than mixing O$_2$ and H$_2$ first). Two O$_2$ mass flow controllers (MFC's) are utilized. One for bulk control of the O$_2$, for around 100-200 sccm, and one for fine control of the O$_2$, for around 5 sccm. Process argon (Ar) could also be added to the mixture. This ensures a homogenous gas mixture before it enters the chamber. In one embodiment, The H and N gas may be turned off prior to the complete formation of the SiO$_x$N$_y$C$_z$:H$_w$ film so as to not poison the photo-resist layer to be formed on top. In one example, a gas flow mixture ratio of 20% O$_2$/60% N$_2$/20% Ar is provided to a processing region of a chamber that is maintained at 3.5 mTorr while a 3 kW pulsed DC power is delivered to the target. However, in some cases, the gas flow mixture may be provided to the processing region of the chamber while a DC, a pulsed DC, an RF and/or a pulsed RF power is delivered to the target.

Figure 7:
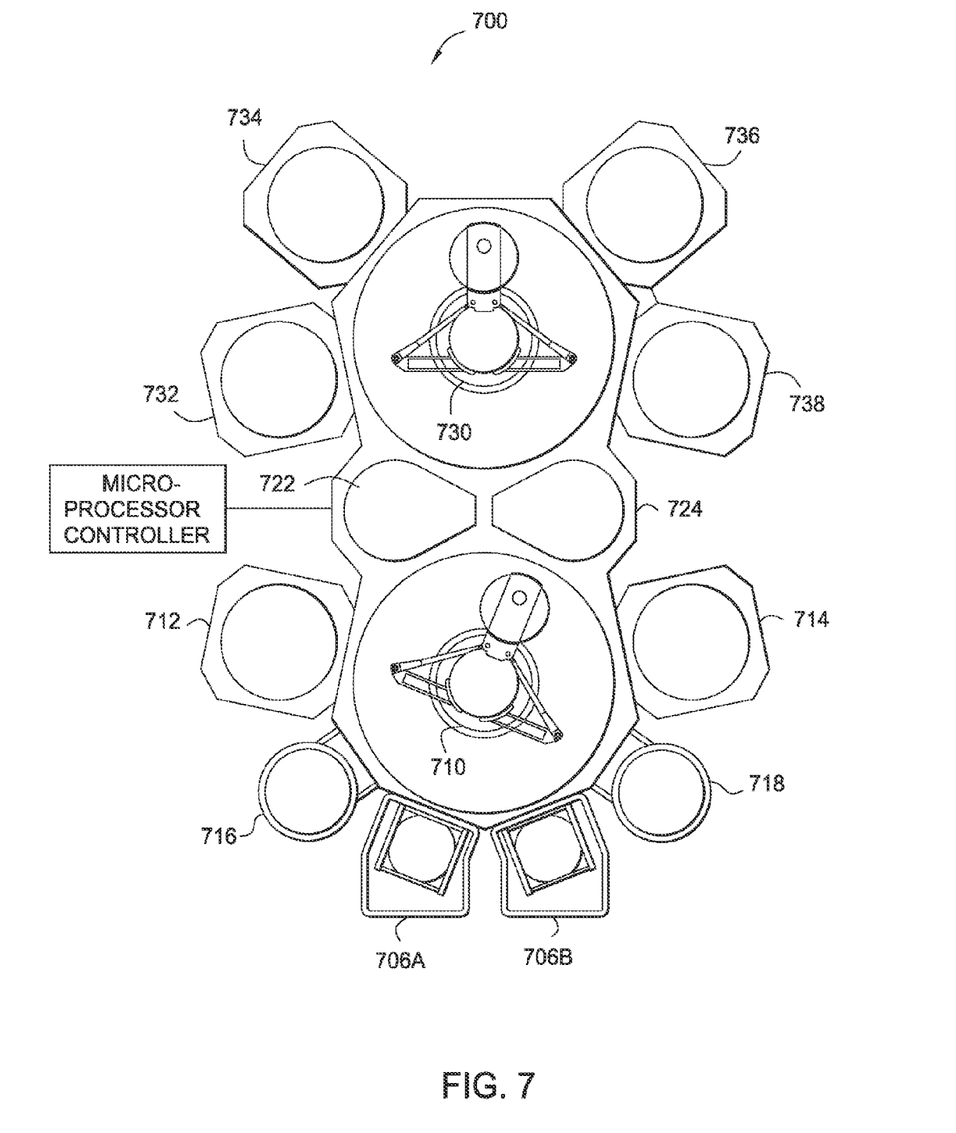
FIG. 7 illustrates an exemplary cluster tool 700 suitable for lithographically creating a multi-patterned hardmask on a substrate.

The exemplary physical vapor deposition (PVD) process chamber 300 may be part of a cluster tool. FIG. 7 illustrates an exemplary cluster tool 700 suitable for creating and etching a multi-patterned hardmask on a substrate. The cluster tool 700 features at least one physical vapor deposition (PVD) chamber 300, as described above. An example of the cluster tool 700 is the Endura® system available from Applied Materials, Inc., of Santa Clara, Calif. Cluster tools manufactured by others may be used as well.

The cluster tool 700 can include one or more load lock chambers 706A, 706B for transferring of substrates into and out of the cluster tool 700. Typically, since the cluster tool 700 is under vacuum, the load lock chambers 706A, 706B may "pump down" the substrates introduced into the cluster tool 700. A first robot 710 may transfer the substrates between the load lock chambers 706A, 706B, and a first set of one or more substrate processing chambers 712, 714, 716, 718 (four are shown). Each processing chamber 712, 714, 716, 718, can be outfitted to perform a number of substrate processing operations including the etch processes described herein in addition to cyclical layer deposition (CLD), atomic layer deposition (ALD), chemical vapor deposition (CVD), physical vapor deposition (PVD) such as PVD chamber 300, pre-clean, degas, orientation and other substrate processes.

The first robot 710 can also transfer substrates to/from one or more intermediate transfer chambers 722, 724. The intermediate transfer chambers 722, 724 can be used to maintain ultrahigh vacuum conditions while allowing substrates to be transferred within the cluster tool 700. A second robot 730 can transfer the substrates between the intermediate transfer chambers 722, 724 and a second set of one or more processing chambers 732, 734, 736, 738. Similar to processing chambers 712, 714, 716, 718, the processing chambers 732, 734, 736, 738 can be outfitted to perform a variety of substrate processing operations including the etch processes described herein in addition to cyclical layer deposition (CLD), atomic layer deposition (ALD), chemical vapor deposition (CVD), physical vapor deposition (PVD), pre-clean, thermal process/degas, and orientation, for example. Any of the substrate processing chambers 712, 714, 716, 718, 732, 734, 736, 738 may be removed from the cluster tool 700 if not necessary for a particular process to be performed by the cluster tool 700.

An illustrative multi-processing cluster tool 700 for forming the structures of FIGS. 4A-4M can include up to four PVD chambers 732, 734, 736, 738 (with an option for a fifth chamber between 734 and 736) similarly configured to the PVD chamber 300 described above. The PVD or ALD chambers 712 or 714 may be configured to deposit a thin ARC/ashing layer (e.g., AlN or SiN or TiN). The thermal treatment chambers 716, 718 may be capable of performing a thermal treatment process, such as a degas process. The degas process may remove potential contaminants which may otherwise outgas during chamber operations. In one configuration the thermal treatment chamber 716, 718 is adapted to complete a degas process at a temperature of about 200-300 degrees C. and pressure in the 100 mTorr or less range. Additionally, the thermal treatment chamber 716, 718 may preheat the substrates prior to processing in the cluster tool 700.

Figures 4A, 4B, 4C, 4D, 4H, 4I, 4J:
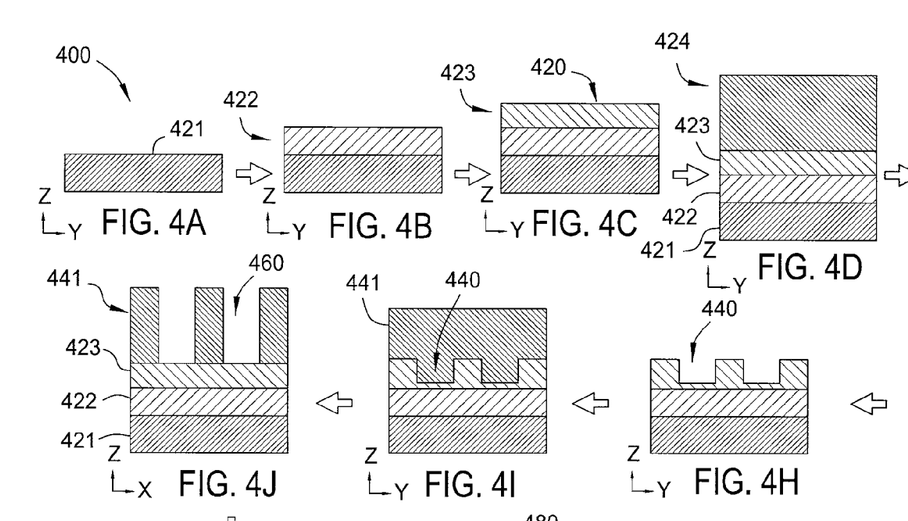

The cluster tool 700 may be used to performed the methods described in FIG. 2 above and FIG. 4 below. During processing, a substrate that is to be processed may arrive to the cluster tool 700 in a pod (not shown). The substrate is transferred from the pod to the vacuum compatible load lock 706A, 706B by the factory interface robot (not shown). The first robot 710 then moves the substrate into the degas chamber 716 or 718 for degassing and preheating. The first robot 710 then picks up the substrate from the degas chamber 716 or 718 and loads the substrate into the intermediate transfer chamber 722 or optionally into chamber 712 or 714 for deposition of an ARC/ashing layer (e.g., AlN layer) and then into the intermediate transfer chamber 722. The second robot 730 moves the substrate from the intermediate transfer chamber 722 into the PVD chamber 732, 734, 736 or 738. A hardmask layer (e.g., hardmask layer 205 in FIG. 2) may be formed on the substrate in the PVD Chamber 732, 734, 736 or 738. The second robot 730 then picks up the substrate from the PVD Chamber 732 and transfers the substrate into the intermediate transfer and cooling chamber 724. The first robot 710 moves the substrate to the load lock 706B, so that the subsequent lithographic operations can be performed on the substrate external to the cluster tool 700.

In some process flows, it may be desirable for the hardmask layer containing substrate to be further processed in the cluster tool 700, or more typically be processed in a separate cluster tool that is configured similarly to the cluster tool shown in FIG. 7. In either case, the patterned resist containing substrate is placed in the load lock chamber 706A. The first robot 710 then loads the substrate into the thermal processing chamber 716. The substrate is exposed to a degassing process in the thermal processing chamber 716. The first robot 710 then picks the substrate from the thermal processing chamber 712 and transfers the substrate through the transfer chamber 724 to the second robot 730 and into the etch chamber 714 for etching of the hardmask and thereafter ashing of the substrate. The cluster tool 700 may move the substrate from the etch chamber 714 to the thermal treatment chamber 716 for a subsequent degassing. This process may repeat itself until a complete pattern if formed in the hardmask layer and the substrate is placed in the etch chamber 714 for etching the underlying layer.

FIGS. 4A to 4M show a sequence of fabrication of a plurality of intersecting trenches 492, 492 into the optically tunable "memorization" or hardmask layer 423. In FIG. 4A an underlying substrate, into which a pattern will ultimately be etched from the pattern of the hardmask, is shown. In FIG. 4b, an antireflective coating (ARC), such as a TiN ARC layer 422, is formed over the substrate 421. Thereafter, an optically tunable hardmask layer 423 as described herein is deposited over the arc layer 422 as seen in FIG. 4C. A resist layer 424, having optical properties matched to the hardmask layer, is formed thereon such as by spin coating to yield the structure as shown in FIG. 4D.

Figure 4E:
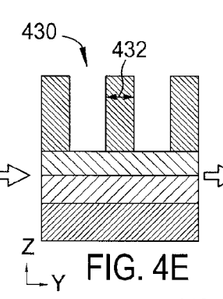
Figure 4F:
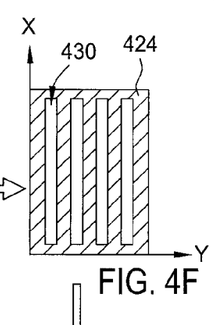
Figure 4G:
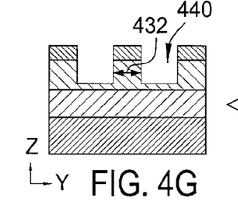

Referring now to FIG. 4E, after exposing the resist layer in a pattern through a mask (not shown) in a lithography process, the resist layer 424 is developed, leaving behind resist layer 424 with features 430 therein, separated by resist having a width or "critical dimension" between features of 432. FIG. 4F shows the top view of the resist covered substrate 421 having the features 430 developed therein. Thereafter, the substrate 421 is exposed to an reactive ion etch environment, wherein an etch gas selective to etching the underlying hardmask material is in traduced and energized in a plasma, and the substrate or substrate holder is biased to directionally etch openings 440 at least partially inwardly of the surface of the hardmask layer 423 copying the pattern developed in the resist. As shown in FIG. 4G, the resulting structure has openings 440 separated by a wall of the hardmask layer 423 maintaining the critical dimension 432 formed in the resist layer 424 during exposure and developing thereof. Thereafter, the remaining portion of the resist overlaying the patterned hardmask layer 403 is stripped in an $O_2$ or $H_2/O_2$ remote plasma, to ash (strip) the resist without significantly or meaningfully affecting the optical properties of the underlying hardmask layer 403, resulting in the profile shown in FIG. 4H.

Figure 4K:
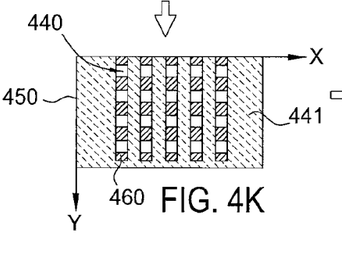
Figure 4L:
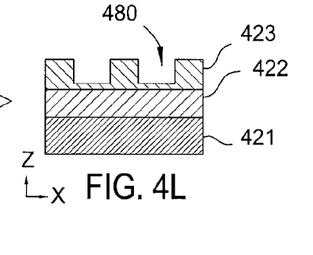
Figure 4M:
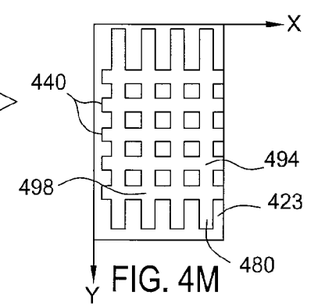

Referring now to FIG. 4I, the partially etched hardmask layer has a second photo-resist layer 441 formed thereon by spin coating or the like, wherein the second resist also is optically matched to the optically tuned hardmask layer 403. Thereafter, as shown in FIG. 4K, trench features are exposed and developed in the resist layer 441, wherein the trench features 460 extend orthogonally to the trench features 430 in the first resist layer 441. In FIGS. 4J to 4L, the substrate is rotated 90 degrees compared to the previous Figures. Thereafter, the underlying hardmask layer 423 is etched through the resist layer 441 features to provide the trenches 480 as shown in FIGS. 4L and 4M.

By using an optically tunable hardmask, multiple near nanopatterns, in the FIG. 4 trenches, may be formed in consecutive patterning steps on the same hardmask layer, by only stripping off of the used resist, cleaning the surface, and applying a new resist, thus significantly reducing the time, cost, and complexity of multi-patterning of a hardmask.

Although descriptions in this disclosure relate to the methods for matching the refractive index (n) and extinction coefficient ($\mathcal{K}$) of a hardmask to a photo-resist, the same means for matching these properties can be applied to other material layers as well. For instance, depositing a matching material can be considered for use as ARC films, Passivation films or buffer films. PVD films are differentiated for their high purity, high density and capability for low temperature deposition. Use of this invention could change the patterning materials and film stacks currently in use. Thus, the methods for forming a hardmask may be applied to a variety of layers and materials undergoing a lithographic operation.

While the foregoing is directed to embodiments of the present invention, other and further embodiments of the invention may be devised without departing from the basic scope thereof, and the scope thereof is determined by the claims that follow:

What is claimed is:

1. A method for forming a hardmask on a film stack, comprising:
   sputtering a material comprising silicon from a target disposed in a chamber onto a surface of a substrate; and
   delivering a flow of a process gas while sputtering the material from the target, wherein the process gas comprises oxygen and nitrogen, and
   wherein a ratio of oxygen to nitrogen in the process gas is adjusted so that optical properties of the sputtered material has substantially similar values as the optical properties of a photo-resist layer, which is to be disposed on a surface of the sputtered material, at an intended lithography exposure wavelength.

2. The method of claim 1, wherein the optical properties include a refractive index and an extinction coefficient.

3. The method of claim 2, wherein the exposure wavelength is 193 nm.

4. The method of claim 1, wherein the process gas further comprises carbon.

5. The method of claim 2, wherein the optical properties of the sputtered material are substantially different than the optical properties of the photoresist at a pattern alignment wavelength.

6. The method of claim 1, wherein the sputtered material comprises silicon, nitrogen, oxygen and hydrogen, wherein a concentration of hydrogen at the surface of the sputtered material is less than an average hydrogen concentration through a thickness of the sputtered material, or a concentration of nitrogen at the surface of the sputtered material is less than an average nitrogen concentration through the thickness of the sputtered material.

7. The method of claim 1, further comprising:
   biasing an electrode coupled to a portion of the chamber to increase the hydrophobicity of the surface of the substrate.

8. The method of claim 1, further comprising depositing the photo-resist layer directly on the surface of the sputtered material.

9. The method of claim 8, wherein the optical property includes both a refractive index and an extinction coefficient, and the deposited photo-resist layer has both the refractive index between 1.5 and 1.8 and the extinction coefficient is between 0.00 and 0.12 at a wavelength of 193 nm.

10. The method of claim 1, further comprising:
    depositing the photo-resist layer directly on the surface of the sputtered material, wherein the photo-resist layer comprises a first photo-resist layer;
    patterning the sputtered material using the first photo-resist layer;
    depositing a second photo-resist layer directly on a surface of the patterned sputtered material, wherein an optical property of the second photo-resist layer has a substantially equivalent value as the optical property of the patterned sputtered material at the second photo-resist layer's lithography exposure wavelength; and
    patterning the sputtered material using the second photo-resist layer.

11. The method of claim 1, further comprising:
    depositing the photo-resist layer directly on the surface of the sputtered material;
    performing a lithography operation on the photo-resist layer to form a pattern in the photo-resist layer;
    etching the formed pattern in the sputtered material; and
    removing the photo-resist layer, wherein removing the photo-resist layer comprises ashing the photo-resist layer using a remote $O_2$ plasma or a remote $H_2/N_2$ plasma.

12. A method for forming a hardmask on a film stack, comprising:
    sputtering a material comprising silicon from a target disposed in a chamber onto a surface of a substrate; and
    delivering a flow of a process gas while sputtering the material from the target, wherein the process gas comprises oxygen and nitrogen, and
    wherein a ratio of oxygen to nitrogen in the process gas is adjusted so that optical properties of the sputtered material has substantially similar values as the optical properties of a photo-resist layer, which is to be disposed on a surface of the sputtered material, at an intended lithography exposure wavelength, wherein the process gas comprises a gas that is selected from a group consisting of argon, helium, neon, krypton, xenon, nitrogen, forming gas, ammonia, oxygen, hydrogen, water, and a gas that comprises carbon.

13. The method of claim 12, wherein the process gas comprises methane ($CH_4$), carbon monoxide (CO), or carbon dioxide ($CO_2$).

* * * * *